United States Patent
Bergstedt et al.

(10) Patent No.: US 6,617,509 B1
(45) Date of Patent: Sep. 9, 2003

(54) ARRANGEMENT RELATING TO CONDUCTOR CARRIERS AND METHODS FOR THE MANUFACTURE OF SUCH CARRIERS

(75) Inventors: Leif Bergstedt, Sjömarken (SE); Per Ligander, Göteborg (SE); Spartak Gevorgian, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/495,481

(22) Filed: Feb. 1, 2000

(30) Foreign Application Priority Data

Feb. 2, 1999 (SE) .................................... 9900349

(51) Int. Cl.[7] .............................................. H01B 7/34
(52) U.S. Cl. ......................................... 174/36; 174/261
(58) Field of Search ........................ 174/260, 36, 261, 174/255; 361/541, 734, 763, 766, 816

(56) References Cited

U.S. PATENT DOCUMENTS

| | | | | |
|---|---|---|---|---|
| 4,441,088 A | | 4/1984 | Anderson | |
| 4,490,690 A | | 12/1984 | Suzuki | |
| 4,870,541 A | * | 9/1989 | Cole | ........................... 361/328 |
| 4,885,431 A | * | 12/1989 | Kawakami et al. | |
| 5,426,399 A | | 6/1995 | Matsubayashi et al. | |
| 5,466,892 A | * | 11/1995 | Howard et al. | .............. 174/261 |
| 5,592,391 A | * | 1/1997 | Muyshondt et al. | ........ 364/489 |
| 5,764,489 A | * | 6/1998 | Leigh et al. | ................. 361/777 |
| 5,786,979 A | * | 7/1998 | Douglass | ..................... 361/328 |
| 5,844,783 A | * | 12/1998 | Kojima | ......................... 361/777 |
| 5,945,886 A | * | 8/1999 | Millar | ............................ 333/1 |
| 6,040,524 A | * | 3/2000 | Kobayashi et al. | |
| 6,153,833 A | * | 11/2000 | Dawson et al. | |
| 6,175,087 B1 | * | 1/2001 | Keesler et al. | |
| 6,239,980 B1 | * | 5/2001 | Fillion et al. | ................. 361/760 |
| 6,239,983 B1 | * | 5/2001 | Shingai et al. | ............... 361/768 |
| 6,284,982 B1 | * | 9/2001 | Kusner et al. | ............... 174/255 |

FOREIGN PATENT DOCUMENTS

| EP | 354671 | 2/1990 |
|---|---|---|
| JP | 341803 | 2/1991 |

* cited by examiner

*Primary Examiner*—Kamand Cuneo

(57) ABSTRACT

Method and arrangements for reducing crosstalk between conductors on a conductor carrier, and methods for manufacturing conductor carriers including these arrangements are presented. Crosstalk between the conductors is prevented by providing a dielectric material in the space between each conductor and an earth plane so that the electric field can be tied down within this space and thus prevent leakage of field lines to the co-lateral conductors. The capacitance is increased by an arrangement in the space immediately beneath the conductor so as to reduce the distance between conductors and the earth plane and/or through the medium of a dielectric material that has a higher dielectric index $\epsilon r$ than the dielectric material.

5 Claims, 6 Drawing Sheets

US 6,617,509 B1

ARRANGEMENT RELATING TO CONDUCTOR CARRIERS AND METHODS FOR THE MANUFACTURE OF SUCH CARRIERS

BACKGROUND

The present invention pertains to arrangements relating to conductor carriers, e.g. printed circuit boards, for reducing crosstalk between densely packed conductors. The present invention also relates to methods for the manufacture of conductor carriers that include said arrangements.

In present times, so-called printed circuit boards or component carriers that can be used to implement different types of circuitry in a beneficial manner are used in practically all modern-day electronic equipment. These printed circuit boards have many advantages. For instance, they can be produced easily and can be arranged in the equipment in a readily perceived and space-saving manner, in addition to being easily exchanged. A printed circuit board is comprised of a carrying base part on which there is applied a non-conductive dielectric material on which there are disposed components that are interconnected by thin conductors provided in or on the layer of non-conductive material. The dielectric used is preferably a plastic-based material, wherewith the dielectric index $\epsilon r$ can be varied by including different amounts of additives in said material.

Present-day development trends, e.g. within mobile telephony, lean towards both ever smaller system solutions and, at the same time, towards ever greater transmission frequencies. This results in ever greater demands on the design and dimensioning of the printed circuit boards, wherewith a constantly increasing problem in this respect is one of minimising crosstalk between the more and more densely packed conductors on a printed circuit board.

Crosstalk is an undesirable effect between two conductors due to the electromagnetic field that occurs as a result of the signal currents in respective conductors. This can be understood as a parasitic capacitive and inductive coupling between the conductors. Crosstalk can be considered to be proportional to a coupling coefficient K, defined as $$K = Cm/C = Lm/L.$$

In this relationship, Cm and Lm signify the mutual capacitance and the mutual inductance between two parallel conductors and C and L signify respectively the self-capacitance and the self-inductance of the conductors. In an equivalence interpretation, it suffices either to consider solely the case of a capacitive coupling or solely the case of an inductive coupling. Consequently, the following discussion is concerned solely with the capacitive coupling. The so-defined coupling coefficient is a measurement of the magnitude of an undesired parasitic capacitance in comparison with the self-capacitance of the conductor (c.f. also FIG. 1).

A reduction in crosstalk effects is synonymous with minimising the value of the coupling coefficient K. In order to obtain a high resistance in the space between two conductors, the mutual capacitance Cm between the conductors must be as small as possible. On the other hand, the conductor capacitance C between conductors and the earth plane shall be high. As will be evident from the definition of the coupling coefficient, it is also necessary for the relationship or ratio between the mutual capacitance Cm and the conductor capacitance C to be small.

It is apparent from the general definition of a capacitance $$C = \epsilon_0 \epsilon_r (A \int \underline{E} d\underline{A} / s \int \underline{E} d\underline{s})$$

of an arbitrary electrode arrangement that its size is determined essentially by the conditions in the space between two electrodes. More specifically, this includes both the geometrical dimensions, particularly the spacing of the electrodes, and the intermediate dielectric material, which is characterised by its dielectric index $\epsilon r$.

Hitherto, the simplest method of minimising crosstalk between two conductors has therefore been to increase the distance therebetween. Typical conductor spacings in this respect can be from three to four times the width of the conductors and can reach magnitudes in the order of about 600 $\mu$m–800 $\mu$m. However, this means unacceptable limitations in the design of an optimal printed circuit board design that shall accommodate the largest possible number of components within a small area. Crosstalk can also be minimised by using in the space between the conductors a dielectric material that has a low dielectric index.

An arrangement for minimising crosstalk that occurs between conductors on a printed circuit board is described in EP 0 354 671 A1. Posts of dielectric material that carry metallic conductors are disposed on a metallic base plane. These vertical posts are mutually separated by air-filled spaces that extend right down to the base plane. This results in a reduced capacitive coupling between the conductors and thus also in a reduction in crosstalk, among other things.

JP 3-041 803 A teaches another arrangement for reducing crosstalk between conductors on a printed circuit board. This is achieved by including between the conductors an arrangement that consists of a dielectric material that has a lower dielectric index than the other dielectric material.

SUMMARY

The present invention addresses the problem of reducing crosstalk between densely packed conductors on a printed circuit board, for instance.

A first object of the invention is to reduce crosstalk effects between two conductors on a printed circuit board.

Another object of the present invention is to provide a printed circuit board that includes an arrangement for reducing crosstalk effects between two conductors, wherewith functioning of said arrangement is essentially independent of the distance between said two conductors and of the material present therebetween.

A further object of the present invention is to provide a method of manufacturing the inventive arrangement.

These objects are achieved in accordance with the invention, by providing a high capacitance in a space between each of the conductors and the earth plane, if possible a narrow space, and therewith bind the electric field to said earth plane substantially within said space, so as to prevent the leakage of field lines to the co-lateral conductors such that crosstalk between said conductors is prevented.

The invention is based on the realisation that this increase in capacitance can be achieved by disposing in the space immediately beneath a signal conductor an arrangement that consists of a thinner dielectric layer and/or a dielectric material that has a higher dielectric index $\epsilon r$ than the remaining dielectric material.

In one advantageous embodiment, the arrangement is narrower than the width of the conductor and is placed symmetrically thereto.

The inventive arrangement and the methods of producing printed circuit boards that include said arrangement have the characteristic features disclosed more specifically in respective Claims.

A first advantage afforded by the inventive arrangement is that crosstalk between conductors is reduced.

Another important advantage afforded by the invention is that this effect is achieved essentially regardless of the geometry of the printed circuit board or of its material properties in the space between said conductors. This enables, for instance, appropriate selection of the dielectric material in this space. A material that has a low electric index $\epsilon r$ enables crosstalk to be further reduced.

This also means that said effect is independent of the design of the printed circuit board and does not restrict dimensioning of the board and the arrangement of conductors thereon. Thus, the conductors can be packed more densely on the printed circuit board without limitations due to crosstalk effects, so that the distance between two conductors may be of the same order of magnitude as the width of the conductors.

A further advantage afforded by the invention is that the increase in capacitance that reduces crosstalk can be achieved in two different ways, which may be used either individually or, preferably, in co-operation with one another.

BRIEF DESCRIPTION OF THE DRAWINGS

The present invention will now be described in more detail with reference to preferred embodiments thereof and also with reference to the accompanying drawings.

DETAILED DESCRIPTION

Figure 1:
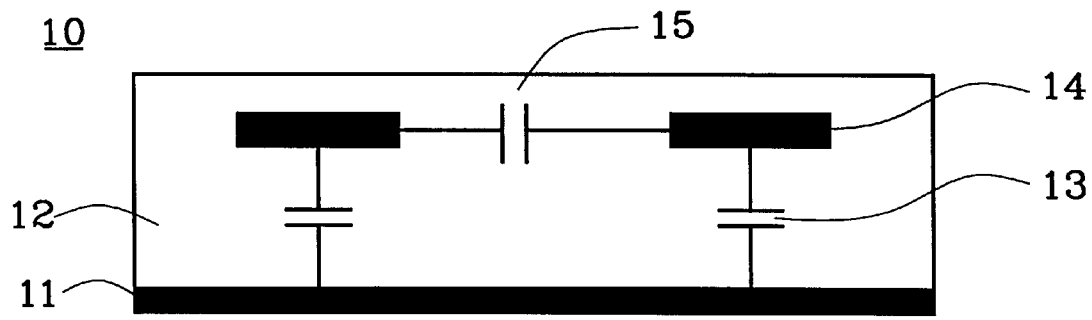
FIG. 1 is a symbolic circuit diagram showing the capacitive couplings that occur on a printed circuit board.

FIG. 1 is a cross-sectional view of a printed circuit board 10 that comprises a carrier part 11 that has a dielectric material 12 having a given dielectric index $\epsilon r$ disposed thereon. The illustrated circuit board has, for instance, two mutually parallel conductors 14 embedded in the dielectric material. Crosstalk between these conductors is determined by the mutual capacitance 15 (Cm) between the conductors, and the capacitances 13 (C) between respective conductors and the carrier part, which is used as the earth plane. A high capacitance C between respective conductors and the earth plane, and a low capacitance Cm between two mutually adjacent conductors are necessary in order to restrict the electromagnetic field to the space between said conductors and the earth plane.

Figure 2:
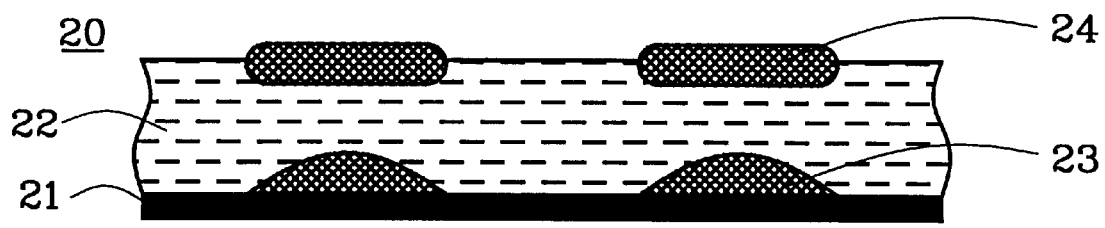
FIG. 2 illustrates a first preferred embodiment of a printed circuit board that includes an inventive arrangement for reducing crosstalk.

FIG. 2 illustrates a first preferred embodiment of an inventive printed circuit board. Similar to the circuit board of FIG. 1, the printed circuit board shown in FIG. 2 includes a supportive earth plane 21 on which a layer of dielectric material 22 has been provided. In the illustrated case, two conductors 24 are embedded in the dielectric material. In this embodiment, a high capacitance C is achieved between conductors 24 and the earth plane 21, by reducing their distance to the earth plane. This is achieved by placing a layer 23 of conductive material directly on the earth plane 21, in the space beneath the conductors 24. The layer 23 is provided with a raised surface that extends above the earth plane 21 and across said layer.

As shown in FIG. 2, the inventive concept can vary in different alternative embodiments. These alternatives are primarily concerned with the design of the space between the conductors and the design of the conductors themselves.

Figure 3:
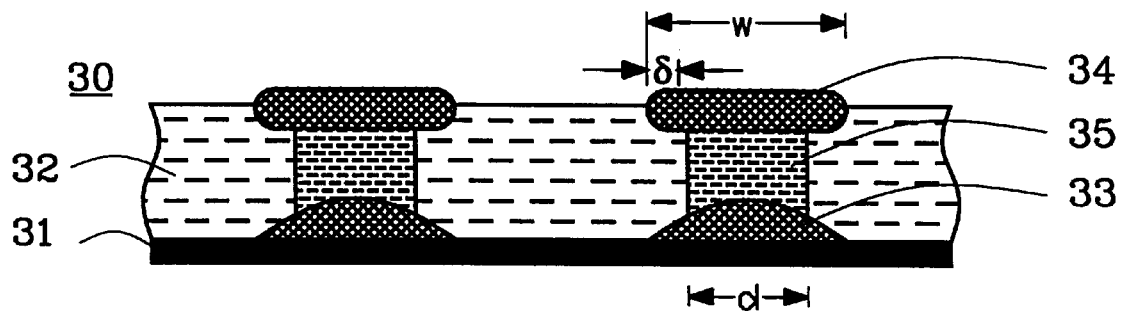
FIG. 3 illustrates a second, alternative embodiment of a printed circuit board according to FIG. 2 that includes the inventive arrangement and which also includes a dielectric material that has a high dielectric index.

FIG. 3 illustrates an alternative embodiment in which the space between the conductor 34 and the conductor 33 arranged on the earth plane 31 is filled with a dielectric material 35 that has a higher dielectric index $\epsilon r2$ than the other dielectric material 32 on said earth plane, which has a low dielectric index $\epsilon r1$. This results in a further increase in capacitance.

The space between the conductors 34 and the conductors 33 arranged on the earth plane can be filled completely with a layer of said high-index dielectric material 35. However, it is beneficial for this layer 35 to be narrower than the conductors. This enables a major part of the electric field to be tied down to a narrow space beneath each conductor. This is particularly beneficial at high signal frequencies where the currents are mainly led proximal to the outer edges of the conductors. In a preferred embodiment of the invention, the width d of this high-index dielectric material is dimensioned in accordance with the formula $d < (w - 2\delta)$, wherewith $\delta$ signifies the accepted penetration depth for current in a conductor, and w is the width of the conductor.

Figure 4:
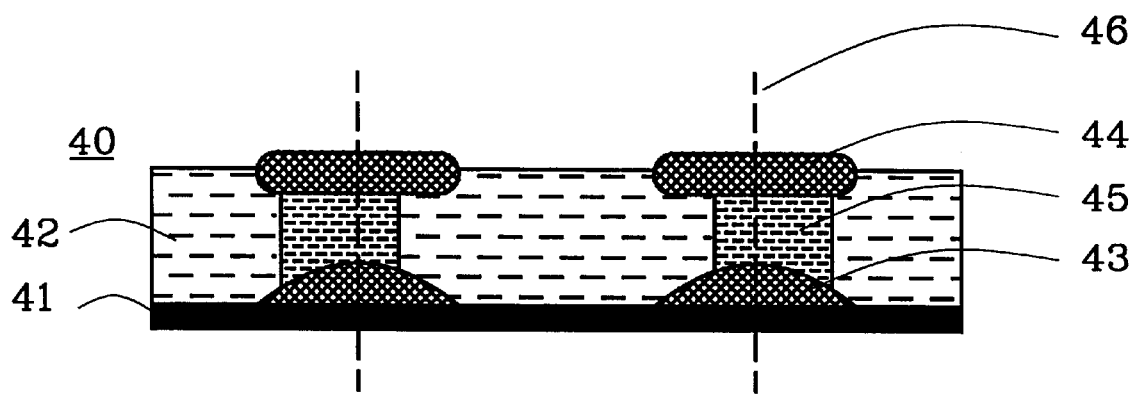
FIG. 4 illustrates an embodiment that includes only two conductors.

In the FIG. 3 embodiment, the layer 35 of high-index dielectric material has been disposed symmetrically with respect to the symmetry axis (not shown) of the conductors. This is the preferred embodiment in the case of conductor carriers that carry a plurality of mutually juxtaposed conductors. FIG. 4 shows as a special case a printed circuit board 40 that has only two conductors 44. In this regard, a conceivable modification is one in which the coupling between the electric fields of respective right-hand and left-hand conductor pairs 43/44 is reduced simply by increasing the distance between the layers 45 of high dielectric material disposed between the aforesaid pairs of conductors 43/44. These layers 45 are displaced slightly, so that the layer beneath the right-hand conductor pair 43/44 will be offset slightly to the right and the layer beneath the left-hand conductor pair 43/44 offset slightly to the left in respect of the symmetry axes 46 of respective conductor pairs.

The design of the conductors 23 arranged directly on the earth plane can also be modified within the scope of the inventive concept. For instance, the conductors 23 may have a rectangular cross-sectional shape or may have the same cross-sectional shape as that of the conductors 24. In order to tie down the electric field to within, if possible, a narrow space between the conductors 23/24 the conductors 23 are arranged directly on the earth plane 21 in the preferred embodiment, such that the thickness of each conductor decreases towards the outer extremities thereof in a direction parallel with the earth plane. This embodiment may also be combined with a high-index dielectric material in the space between the conductors 23/24.

Figure 5:
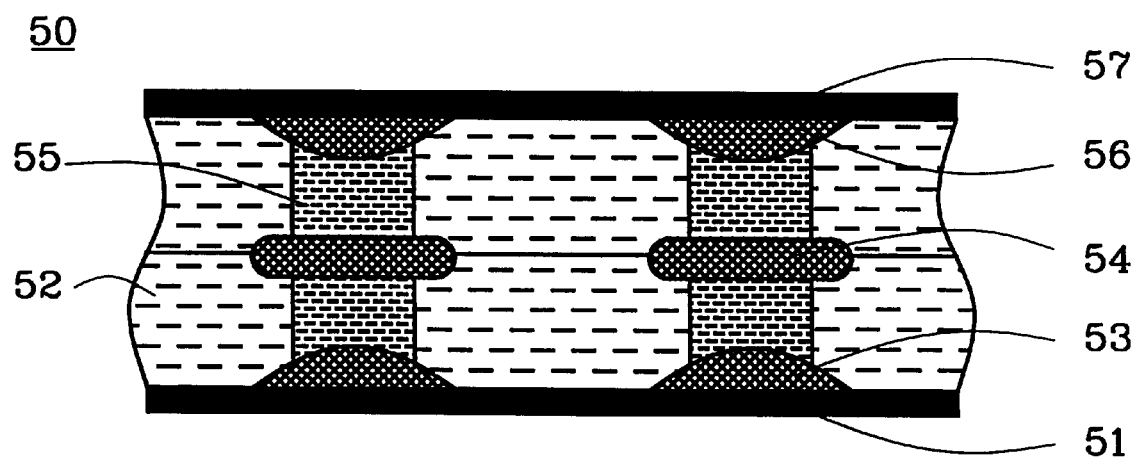
FIG. 5 illustrates another alternative embodiment, in which the inventive arrangement is arranged in a microstrip conductor.

The present invention can also be applied to advantage in other applications. FIG. 5 illustrates by way of example the inventive arrangement incorporated in a microstrip conductor 50. A microstrip conductor has two earth planes 51 and 57 and a first conductor structure 54 embedded in first dielectric material 52 disposed between said earth planes. A second conductor structure 53 is arranged on a first earth plane 51 and a third conductor structure 56 is arranged on the second earth plane 57 in a corresponding manner. These conductor structures 53 and 56 form raised surfaces across respective earth planes which are overlapped by the first conductor structure. Thus, a high capacitance C is achieved between the conductors 54 and the earth plane 51 and the earth plane 57 respectively, by reducing the distance between the conductors 54 and respective earth planes 51 and 57.

In order to concentrate the electric field within, if possible, a narrow space beneath the conductors, the conductors 54 and 56 arranged directly on the earth planes 51 and 57 are formed so that the thickness of each conductor decreases towards the outer extremities thereof in a direction parallel with the earth planes. The space between the conductors 54 and the conductors 53 arranged on the earth planes 51 and 57 can be filled with a dielectric material 55 that has a higher dielectric index $\epsilon r2$ than the remaining dielectric material 52, which has a low dielectric index $\epsilon r1$. This results in a further increase in capacity.

Figure 6A:
FIGS. 6a–6c illustrate steps in the manufacture of a printed circuit board according to FIG. 2 with the aid of offset printing.
Figure 6B:
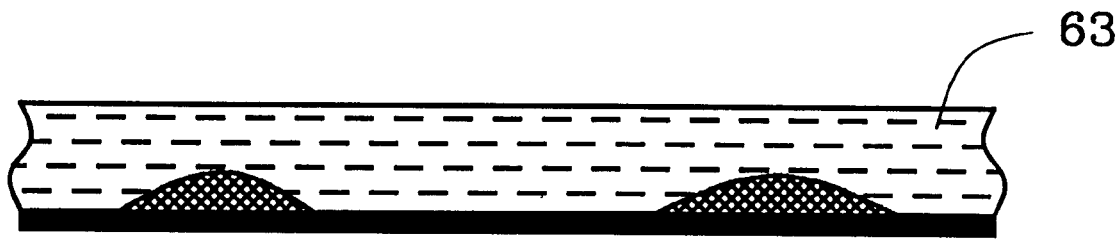
Figure 6C:
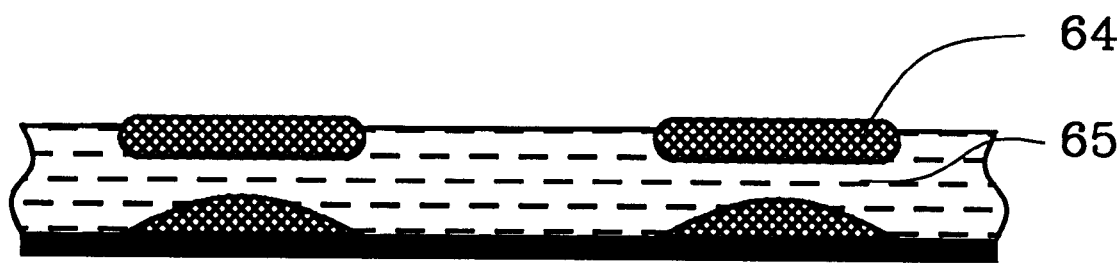

FIGS. 6a–6c, 7a–7d, 8a–8e and 9a–9f describe four methods of manufacturing a printed circuit board that includes the inventive arrangement. A printed circuit board according to respective FIGS. 2 and 3 is produced by means of an offset printing process illustrated in FIGS. 6 and 7. FIGS. 8 and 9 demonstrate the manufacturing steps entailed in producing a printed circuit board according to FIG. 3 while using a photosensitive dielectric material. FIGS. 6a–6c describe the manufacture of a printed circuit board solely with dielectric material. In a first step (FIG. 6a), a first conductor structure 62 is printed directly on the carrier base part 61, which functions as a circuit board earth plane. A layer 63 of dielectric material is then printed on the base part 61 and on the conductor structure 62 (FIG. 6b). In a last step (FIG. 6), a second conductor structure 64 is printed onto said dielectric material such that the second conductor structure will overlap the first conductor structure in respect to their cross-directions. Thus, the desired increase in capacitance between the conductor 64 and the base part 61 that functions as an earth plane is achieved by reducing the thickness of the dielectric material 63 in the space 65 between the conductors. This is achieved by changing the thickness of the conductors 62 in correspondence with the capacitance that shall be obtained between the conductors 62 and 64.

Figure 7A:
FIGS. 7a–7d illustrate steps in the manufacture of a printed circuit board according to FIG. 3 with the aid of offset printing.
Figure 7B:
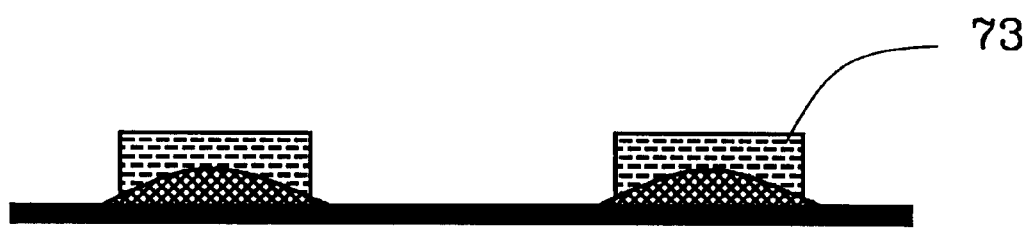
Figure 7C:
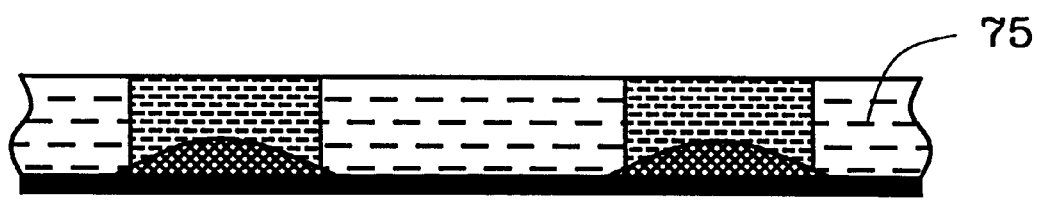
Figure 7D:
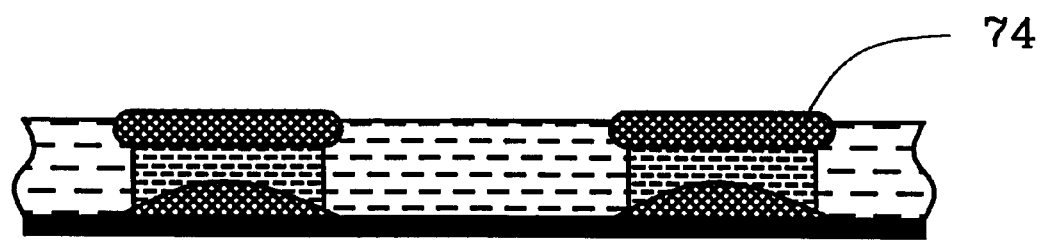

FIGS. 7a–7d describe a method of manufacturing a printed circuit board that includes two different dielectric materials. As described above, the desired conductor structure 72 is printed directly on the carrying base part 71 (FIG. 7a). A layer 73 of one high dielectric material (FIG. 7b) is then printed onto these conductors 72, whereafter the remaining part of the base part 71 is coated with a layer of another dielectric material, preferably a material that has a low dielectric index $\epsilon r$ (FIG. 7c). In last step (FIG. 7d), a second conductor structure 74 is printed on this dielectric material in a manner such that the second conductor structure will overlap the first conductor structure in respect of their cross-directions.

Figure 8A:
FIGS. 8a–8e illustrate steps in the manufacture of a printed circuit board according to FIG. 3 with the aid of photo-sensitive dielectric varnish, and plating of the conductors.
Figure 8B:
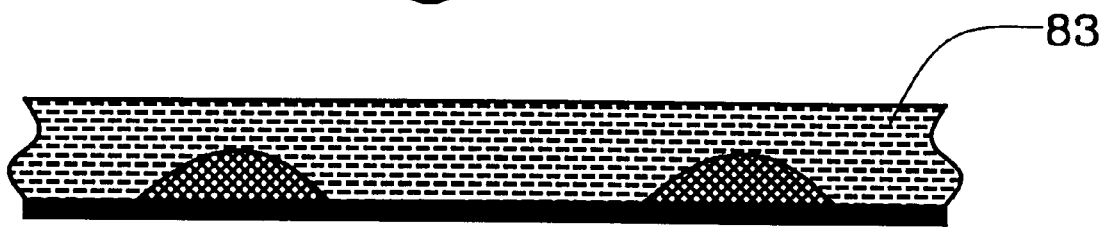
Figure 8C:
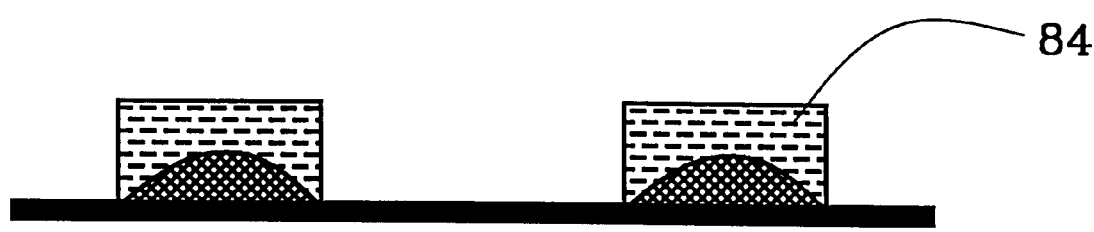
Figure 8D:
Figure 8E:
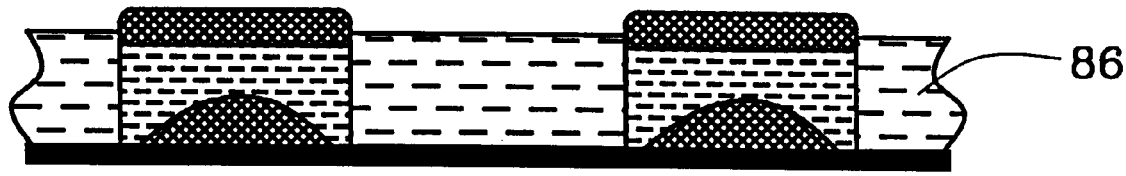

FIGS. 8a–8e describe a first method of manufacture using photosensitive dielectric material. A first conductor structure 82 (FIG. 8a) is applied to a carrying base part 81. This is done in a well-known manner, which is not shown explicitly. For example, the base part 81 is covered with a protective layer with the exception of apertures provided therein, these apertures then being filled with a conductive material so that the conductor structure 82 will be obtained when the protective layer is removed. The base part 81 and the conductor structure 82 are then covered with a photosensitive high dielectric varnish 83 (FIG. 8b), whereafter a layer 84 is exposed over said first conductor structure 82 (FIG. 8c) by photolithography. A second conductor structure 85 (FIG. 8d) is then applied on the layer 84 by plating said layer. The complete structure is finally covered with a layer 86 of another dielectric material, preferably a material that has a low dielectric index $\epsilon r$ (FIG. 8e).

Figure 9A:
FIGS. 9a–9f illustrate steps in the manufacture of a printed circuit board according to FIG. 3 with the aid of photo-sensitive dielectric varnish and surface plating of the conductors prior to exposure.
Figure 9B:
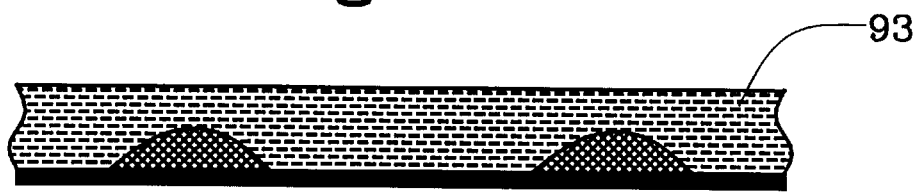
Figure 9C:
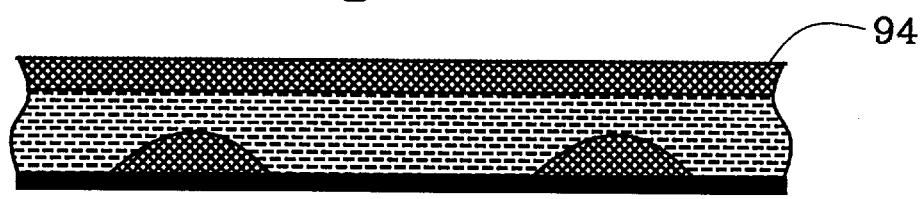
Figure 9D:
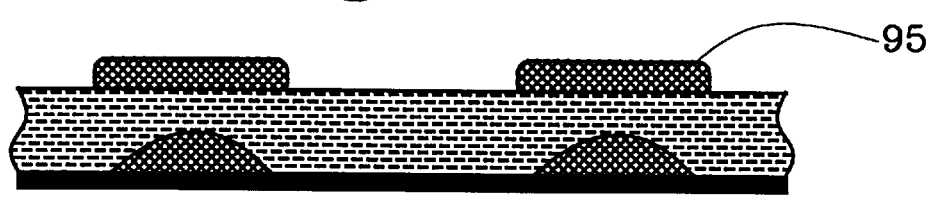
Figure 9E:
Figure 9F:
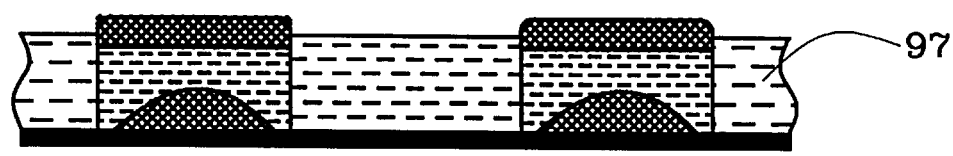

FIGS. 9a–9f describe an alternative method of manufacture in which a photosensitive dielectric material is used. The base part 91 and the first conductor structure 92 are first covered with a layer 93 of photosensitive high dielectric varnish (FIG. 9b). This layer 93 is then surface-plated with a copper layer 94 prior to developing the layer 93 (FIG. 9c). The layer 94 is patterned in a following step, so as to obtain a second conductor structure 95, said second conductor structure 95 overlapping the first conductor structure 93 in the cross-direction of said conductors (FIG. 9d). As opposed to the method described in FIG. 8, this method of manufacture is characterised in that the layer 95 can then be used as a pattern transfer medium for developing the high dielectric material 93 so that said material will then be found solely in the spaces between conductor structure 92 and 95 (FIG. 9e). The resultant structure is finally covered with a layer 97 of another dielectric material, preferably with a material that has a low dielectric index $\epsilon r$ (FIG. 9f).

FIGS. 8a–8e and 9a–9f relate to methods of manufacturing a printed circuit board according to FIG. 3. It will be readily understood, however, that the arrangement according to FIG. 2 can also be produced by the methods described in these Figures.

It will also be understood that the invention is not restricted to the aforedescribed and illustrated embodiments thereof, and that modifications can be made within the scope of the accompanying claims.

What is claimed is:

1. An arrangement comprising:
   at least one earth plane as a carrying base part and first electric conductors which form a first conductor structure;
   a first capacitive coupling existing between two mutually adjacent the first conductors and a second capacitive coupling existing between each of the first conductors and the earth plane; and
   a second conductor structure having second conductors comprised of a conductive material which is applied directly onto said earth plane and that extends slightly above said earth plane;
   wherein the first and the second conductor structures are disposed in such a manner that respective conductors of the first conductor structure overlap mutually opposite respective conductors of the second conductor structure in respect of their cross-directions, and in that a first dielectric material having a dielectric index $\epsilon r1$ is disposed between the first and second conductor structures.

2. The arrangement according to claim 1, further comprising:
   a third conductor structure having conductors comprised of a layer of conductive material applied directly to a second earth plane and extending slightly above the second earth plane;
   wherein the first and third conductor structures are disposed in such a manner that respective conductors of the first conductor structure overlap mutually opposite respective conductors of the third conductor structure in respect of their cross-directions, and in that the second conductor structure and the third conductor structure are each disposed on a respective side of the first conductor structure.

3. The arrangement according to claim 2, wherein the conductors of the second and third conductor structures are formed in a manner such that the cross-sectional thickness of each conductor decreases towards its outer extremities in a direction parallel with the first earth plane.

4. The arrangement according to claim 1, further comprising a second dielectric material coupled between two mutually opposite conductors of the first and second conductor structures having a dielectric index $\epsilon r2$, wherein the dielectric index $\epsilon r2$ is greater than the dielectric index $\epsilon r1$.

5. The arrangement according to claim 4, wherein a layer formed by the second dielectric material is narrower in width than the width of a conductor in the first conductor structure.

* * * * *